(12) United States Patent
Otake et al.

(10) Patent No.: US 12,094,826 B2
(45) Date of Patent: Sep. 17, 2024

(54) SEMICONDUCTOR DEVICE

(71) Applicant: ROHM CO., LTD., Kyoto (JP)

(72) Inventors: Hirotaka Otake, Kyoto (JP); Kentaro Chikamatsu, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 17/930,991

(22) Filed: Sep. 9, 2022

(65) Prior Publication Data

US 2023/0005840 A1 Jan. 5, 2023

Related U.S. Application Data

(63) Continuation of application No. 16/896,119, filed on Jun. 8, 2020, now Pat. No. 11,476,197.

(30) Foreign Application Priority Data

Jun. 11, 2019 (JP) .................................. 2019-108794

(51) Int. Cl.
*H01L 23/498* (2006.01)
*H01L 23/00* (2006.01)
(Continued)

(52) U.S. Cl.
CPC ...... *H01L 23/5383* (2013.01); *H01L 23/3121* (2013.01); *H01L 23/49811* (2013.01);
(Continued)

(58) Field of Classification Search
CPC ......... H01L 23/49811; H01L 23/49861; H01L 23/535; H01L 23/49562
See application file for complete search history.

(56) References Cited

U.S. PATENT DOCUMENTS 9,972,534 B1 5/2018 Chen et al.
2005/0218489 A1 10/2005 Satou et al.
(Continued)

FOREIGN PATENT DOCUMENTS

CN 1750273 A 3/2006
CN 104347618 A 2/2015
(Continued)

OTHER PUBLICATIONS

Office Action dated Mar. 30, 2023 issued by the Japan Patent Office for Japanese Application JP 2019-108794 with machine translation, 7 pages.
(Continued)

*Primary Examiner* — Michele Fan
(74) *Attorney, Agent, or Firm* — XSENSUS LLP

(57) ABSTRACT

A semiconductor chip includes a front surface and a back surface, a source pad, a drain pad and a gate pad on the front surface; a die pad under the semiconductor chip and bonded to the semiconductor chip; a source lead, electrically connected to the die pad; a drain lead and a gate lead, disposed on a periphery of the die pad; and a sealing resin. A plurality of vias for external connection are formed to connect to the source pad. A first subset of the plurality of vias for external connection is disposed along a first side of the source pad, and a second subset of the plurality of vias for external connection is disposed along a second side of the source pad, wherein the first and second sides are arranged adjacent to each other to form a first edge of the source pad.

19 Claims, 13 Drawing Sheets

(51) Int. Cl.
  *H01L 23/31*   (2006.01)
  *H01L 23/538*  (2006.01)
(52) U.S. Cl.
  CPC .. *H01L 23/49822* (2013.01); *H01L 23/49861* (2013.01); *H01L 23/5385* (2013.01); *H01L 24/45* (2013.01)

(56) References Cited

U.S. PATENT DOCUMENTS

| | | |
|---|---|---|
| 2007/0196950 A1 | 8/2007 | Shirai et al. |
| 2007/0262346 A1 | 11/2007 | Otremba et al. |
| 2009/0039869 A1 | 2/2009 | Williams |
| 2009/0224313 A1 | 9/2009 | Burke |
| 2010/0059875 A1 | 3/2010 | Sato et al. |
| 2010/0259201 A1 | 10/2010 | Kawano et al. |
| 2015/0041984 A1 | 2/2015 | Otremba et al. |
| 2015/0145025 A1* | 5/2015 | Yoshida ............ H01L 29/41741 257/329 |
| 2016/0086897 A1* | 3/2016 | Haeberlen ........... H01L 23/4824 257/774 |
| 2017/0104091 A1 | 4/2017 | Tanaka |
| 2017/0221803 A1 | 8/2017 | Kamachi et al. |
| 2019/0221503 A1 | 7/2019 | Nakamura et al. |
| 2020/0111727 A1 | 4/2020 | Tsuno |
| 2020/0365694 A1 | 11/2020 | Ito et al. |

FOREIGN PATENT DOCUMENTS

| | | | |
|---|---|---|---|
| JP | 2006-086398 A | 3/2006 | |
| JP | 2013026342 A * | 2/2013 | ............ H01L 24/49 |
| JP | 2014-060358 A | 4/2014 | |
| JP | 2014-099535 A | 5/2014 | |
| JP | 2017073506 A | 4/2017 | |
| JP | 2017-118099 A | 6/2017 | |
| WO | 2018/061711 A1 | 4/2018 | |

OTHER PUBLICATIONS

Search report dated Mar. 30, 2023 issued by the Japan Patent Office for Japanese Application JP 2019-108794 with machine translation.
Office Action and search report dated Apr. 26, 2023 issued by the China National Intellectual Property Administration for Chinese Application CN 202010441462.2 with machine translation.
Office Action and search report dated Sep. 27, 2023 issued by the China National Intellectual Property Administration for Chinese Application CN 202010441462.2 with machine translation.

* cited by examiner

SEMICONDUCTOR DEVICE

PRIORITY CLAIM AND CROSS-REFERENCE

This application is a continuation of and claiming priority to U.S. non-provisional application Ser. No. 16/896,119 filed Jun. 8, 2020, the disclosure of which is hereby incorporated by reference in its entirety.

BACKGROUND OF THE INVENTION

Field of the Invention

The present invention relates to a semiconductor device, for example, a semiconductor device including a nitride semiconductor chip containing a group III nitride semiconductor (hereinafter sometimes simply referred to as "nitride semiconductor").

Description of the Prior Art

A so-called group III nitride semiconductor refers to a semiconductor using nitride as a group V element in a group III-V semiconductor. Representative examples of the above include aluminum nitride (AlN), gallium nitride (GaN) and indium nitride (InN). In general, an expression below may be used: $Al_xIn_yGa_{1-x-y}N$ (where $0 \le x \le 1$, $0 \le y \le 1$, $0 \le x+y \le 1$).

The industry has proposed a high electron mobility transistor (HEMT) using such nitride semiconductor. The HEMT includes, for example, an electron transit layer having GaN, and an electron supply layer epitaxially growing on the electron transit layer and having AlGaN. A pair of source electrode and drain electrode are formed in a manner of being connected to the electron supply layer, and a gate electrode is disposed between the two.

Due to polarization caused by lattice mismatch between GaN and AlGaN, 2-dimensional electron gas is formed in the electron transit layer, at a position several A from an inner side of an interface between the electron transit layer and the electron supply layer. The 2-dimensional electron gas is used as a channel to connect the source and the drain. If the 2-dimensional electron gas is cut off by applying a control voltage to the gate electrode, the connection between the source and the drain is also cut off. When the control voltage is not applied to the gate electrode, the source and the drain are connected, and thus the transistor becomes a normally on device.

A device using a nitride semiconductor features high withstand voltage, high temperature operation, large current density, fast switching and low on-resistance. Thus, patent document 1 proposes an application in a power device, and the device of said concept is in mass production and well-circulated in market.

Patent document 1 discloses the following configuration: a ridge-shaped p-type GaN gate layer (a nitride semiconductor gate layer) is laminated on an AlGaN electron supply layer, and a gate electrode is disposed on the p-type GaN gate layer. The channel is eliminated by a depletion layer expanding from the p-type GaN gate layer, hence achieving normally off.

PRIOR ART DOCUMENT

Patent Publication

[Patent document 1] Japan Patent Publication No. 2017-73506

SUMMARY OF THE INVENTION

Problems to be Solved by the Invention

As a semiconductor device, a structure in which a source pad, a drain pad and a gate pad on a nitride semiconductor chip are connected to a source lead, a drain lead and a gate lead by metal wires, respectively, is known in the prior art.

However, in said structure, the parasitic inductance in the semiconductor device is hardly considered low enough. Therefore, there are concerns for issues such as avalanche breakdown, malfunction and noise caused by a surge in the drain-source voltage or gate-source voltage.

It is an object of the present invention to provide a semiconductor device for reducing parasitic inductance.

Technical Means for Solving the Problem

The semiconductor device of the present invention includes: a semiconductor chip, including a front surface and a back surface, and including a source pad, a drain pad and a gate pad on the front surface; a die pad, disposed under the semiconductor chip and bonded to the back surface of the semiconductor chip; a source lead, electrically connected to the die pad; a drain lead and a gate lead, disposed on a periphery of the die pad; and a sealing resin, sealing the semiconductor chip, the die pad and each of the leads. A plurality of vias for external connection are formed in the semiconductor chip to connect to the source pad. A first subset of the plurality of vias for external connection is disposed along a first side of the source pad, and a second subset of the plurality of vias for external connection is disposed along a second side of the source pad, wherein the first side and the second side are arranged adjacent to each other to form a first edge of the source pad.

In the foregoing configuration, a semiconductor device for reducing parasitic inductance is provided.

In one embodiment of the present invention, the semiconductor chip includes a substrate on a side of the back surface, and the plurality of vias for external connection are electrically connected to the substrate.

In one embodiment of the present invention, the plurality of vias for external connection respectively include a via hole formed in the semiconductor chip and a conductive film formed in the via hole.

In one embodiment of the present invention, the die pad and the source lead are integrally formed.

In one embodiment of the present invention, the drain pad and the drain lead are connected by a first metal connecting component, and the gate pad and the gate lead are connected by a second metal connecting component.

In one embodiment of the present invention, the semiconductor chip includes: the substrate; a first nitride semiconductor layer, formed on the substrate, constituting an electron transit layer; a second nitride semiconductor layer, formed on the first nitride semiconductor layer, constituting an electron supply layer; a ridge-shaped gate portion, formed on the second nitride semiconductor layer; and a source electrode and a drain electrode, disposed opposite to each other on the second nitride semiconductor layer with the gate portion interposed in between. The gate portion includes a nitride semiconductor gate layer disposed on the second nitride semiconductor layer and having an acceptor impurity, and a gate electrode disposed on the nitride semiconductor gate layer. The source electrode is electrically connected to the source pad, the drain electrode is electrically connected to the drain pad, and the gate electrode is electrically connected to the gate pad.

In one embodiment of the present invention, a distance between a via of the plurality of vias for external connection and the source lead is less than a distance between the via of the plurality of vias for external connection and the drain lead and is less than a distance between the via of the plurality of vias for external connection and the gate lead in plan view.

In one embodiment of the present invention, the semiconductor chip is rectangular in shape in a plan view.

In one embodiment of the present invention, the via of the plurality of vias for external connection further includes a via for external connection disposed along at least one of two sides extending in two directions from a second corner that is diagonal to a first corner in a plan view.

In one embodiment of the present invention, a driving source lead disposed on the periphery of the die pad is further included. The source pad and the driving source lead are connected by a third metal connecting component.

In one embodiment of the present invention, the semiconductor chip further includes: a first inter-layer insulative film, formed on the second nitride semiconductor layer and the gate portion; a first source wire, formed on the first inter-layer insulative film and connected to the source electrode; a second inter-layer insulative film, formed on the first inter-layer insulative film in a manner of covering the first source wire; a second source wire, formed on the second inter-layer insulative film and connected to the first source wire; and a third inter-layer insulative film, formed on the second inter-layer insulative film in a manner of covering the second source wire. The source pad is formed on the third inter-layer insulative film and is connected to the second source wire.

In one embodiment of the present invention, the conductive film and the source pad are simultaneously formed.

In one embodiment of the present invention, at least a portion of a portion of the via hole formed in the substrate forms a bottom portion of the via hole; the conductive film includes a first conductive film formed in the via hole on a portion apart from the bottom portion, and a second conductive film formed on the portion of the bottom portion in the via hole; and the first conductive film and the second conductive film are made of different materials.

In one embodiment of the present invention, an insulative film is formed on a side surface of the via hole.

In one embodiment of the present invention, an inner surface of the via hole includes an annular stepped portion that is generated in the substrate in a manner that a lower diameter of the via hole is less than an upper diameter of the via hole.

In one embodiment of the present invention, the via hole reaches a back surface of the substrate.

DETAILED DESCRIPTION OF THE EMBODIMENTS

Details of the embodiments of the present invention are described with the accompanying drawings below.

Figure 1:
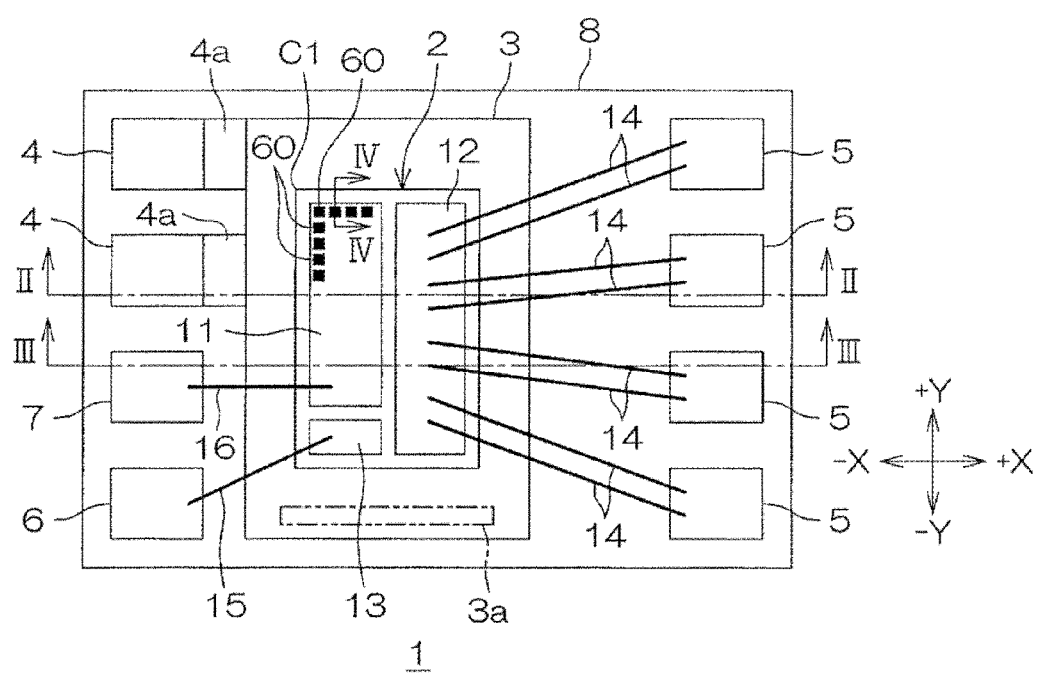
FIG. 1 is a partial top view for illustrating the configuration of a semiconductor device according to an embodiment of the present invention.
Figure 2:
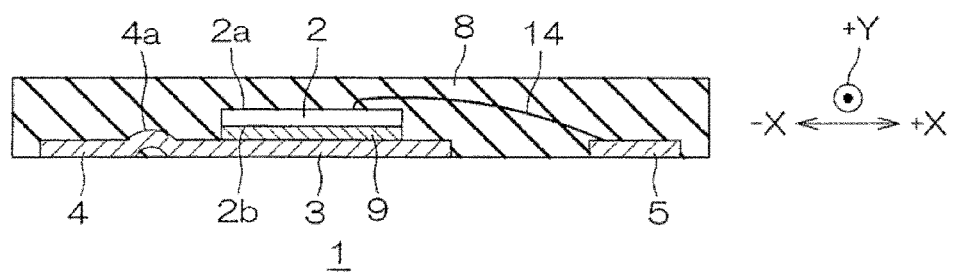
FIG. 2 is a cross-sectional diagram taken along line II-II in FIG. 1.
Figure 3:
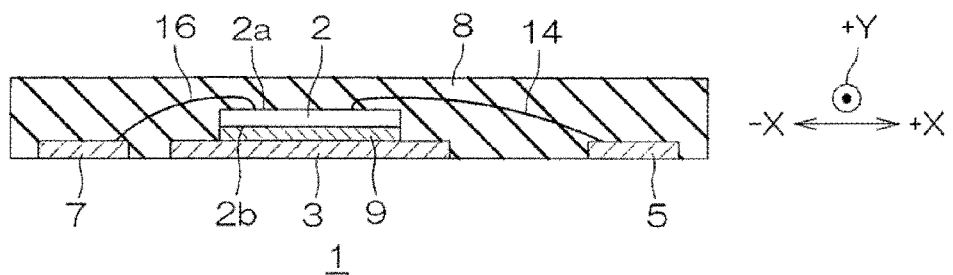
FIG. 3 is a cross-sectional diagram taken along line III-III in FIG. 1.

FIG. 1 shows a schematic top view for illustrating the configuration of a semiconductor device according to an embodiment of the present invention. FIG. 2 shows an enlarged cross-sectional diagram taken along line II-II in FIG. 1. FIG. 3 shows an enlarged cross-sectional diagram taken along line III-III in FIG. 1.

For illustration purposes, a +X direction, a −X direction, a +Y direction and a −Y direction shown in FIG. 1, FIG. 2 and FIG. 3 are sometimes used. The +X direction is a direction specified by a front surface of a semiconductor device 1 in perspective view, and the +Y direction is a direction along the front surface of the semiconductor device 1 and is a direction perpendicular to the +X direction. The −X direction is a direction opposite to the +X direction, and the −Y direction is a direction opposite to the +Y direction. The +X direction and the −X direction are collectively referred to as an "X direction". The +Y direction and the −Y direction are collectively referred to as a "Y direction".

The semiconductor device 1 includes a semiconductor chip (nitride semiconductor chip) 2, a die pad 3, two source leads 4, four drain leads 5, one gate lead 6, one driving source lead 7, and a sealing resin 8. The die pad 3 and the leads 4, 5, 6 and 7 consist of a thin copper-containing metal plate or a thin metal plate of a copper-containing alloy, for example.

The die pad 3 consists of a rectangular thin metal plate in the Y direction in perspective view. The die pad 3 is for supporting the semiconductor chip 2. The leads 4, 5, 6 and 7 are individually electrically connected to the semiconductor chip 2. The sealing resin 8 seals the semiconductor chip 2, the die pad 3 and the leads 4, 5, 6 and 7.

The semiconductor chip 2 is shaped as a rectangle that is lengthwise in the Y direction in perspective view. When a front surface 2a of the semiconductor chip 2 faces upward, a die is bonded on a center portion of the die pad 3. More specifically, a back surface 2b of the semiconductor chip 2 is bonded on a center portion of an upper surface of the die pad 3 by a solder 9.

A source pad 11, a drain pad 12 and a gate pad 13 are formed on the front surface 2a of the semiconductor chip 2. The source pad 11 is formed in substantially an entire region apart from a region on an end portion in the −Y direction on the half part in the −X direction of the front surface 2a of the semiconductor chip 2. The gate pad 13 is formed on an end portion in the −Y direction on the half part in the −X direction of the front surface 2a of the semiconductor chip 2. The drain pad 12 is formed in substantially an entire region on the half part in the +X direction of the front surface 2a of the semiconductor chip 2.

The leads 4, 5, 6 and 7 are individually disposed on the periphery of the die pad 3. The leads 4, 5, 6 and 7 are shaped as rectangles that are lengthwise in the X direction in perspective view. The source leads 4 have a longer length in the X direction compared to the other leads 5, 6 and 7.

The two source leads 4 and the die pad 3 are formed integrally. The two source leads 4 extend from different positions in the Y direction on the end portion in the +Y direction from the side of the −X direction of the die pad 3 toward the −X direction in perspective view. Each of the source leads 4 includes an arched bending portion 4a protruding upward from the end portion in the +X direction connected to the die pad 3 when viewed in the Y direction.

The four drain leads 5 are disposed at intervals from one another in the Y direction at positions on the side of the +X direction of the die pad 3 toward a direction away from the +X direction in perspective view. The drain leads 5 are connected to the drain pad 12 by metal wires 14, respectively.

The gate lead 6 is disposed at a position on the end portion in the −Y direction of the side in the −X direction of the die pad 3 toward a direction away from the −X direction in perspective view. The gate lead 6 is connected to the gate pad 13 by a metal wire 15.

The driving source lead 7 is disposed at a position between the source lead 4 on the side in the −Y direction and the gate lead 6, and on the side in the −X direction of the die pad 3 toward a direction away from the −X direction in perspective view. The gate lead 6 is connected to the gate pad 13 by the metal wire 15.

The sealing resin 8 includes, for example, epoxy. The sealing resin 8 appears as a rectangle that is lengthwise in the X direction in perspective view, and shaped as a flat rectangle in the top-down direction. A lower surface of the die pad 3 is exposed from a lower surface of the sealing resin 8. Lower surfaces of the source leads 4, apart from the bending portions 4a, are exposed from the lower surface of the sealing resin 8. Lower surfaces of the drain leads 5, a lower surface of the gate lead 6, and a lower surface of the driving source lead 7 are exposed from the lower surface of the sealing resin 8.

A plurality of vias 60 for external connection electrically connected to the source pad 11 are formed on a circumferential portion of the semiconductor chip 2. The plurality of vias 60 for external connection in perspective view are disposed near a connecting point of the side in the X direction and a side in the +Y direction of the semiconductor chip, that is, one corner C1, and along the side in the X direction and the side in the +Y direction of the semiconductor chip. As described below, the plurality of vias 60 for external connection are connected to a substrate 21 of the semiconductor chip 2 (referring to FIG. 4). The source pad 11 is electrically connected to the source lead 4 through the vias 60 for external connection, the substrate 21 of the semiconductor chip 2, a back surface electrode 34 of the semiconductor chip 2 (referring to FIG. 4), the solder 9 and the die pad 3.

A distance between each via 60 for external connection and the source lead 4 (the shortest distance) is less than a distance between said via 60 for external connection and the drain lead 5 and is less than a distance between said via 60 for external connection and the gate lead 6 in perspective view.

Figure 4:
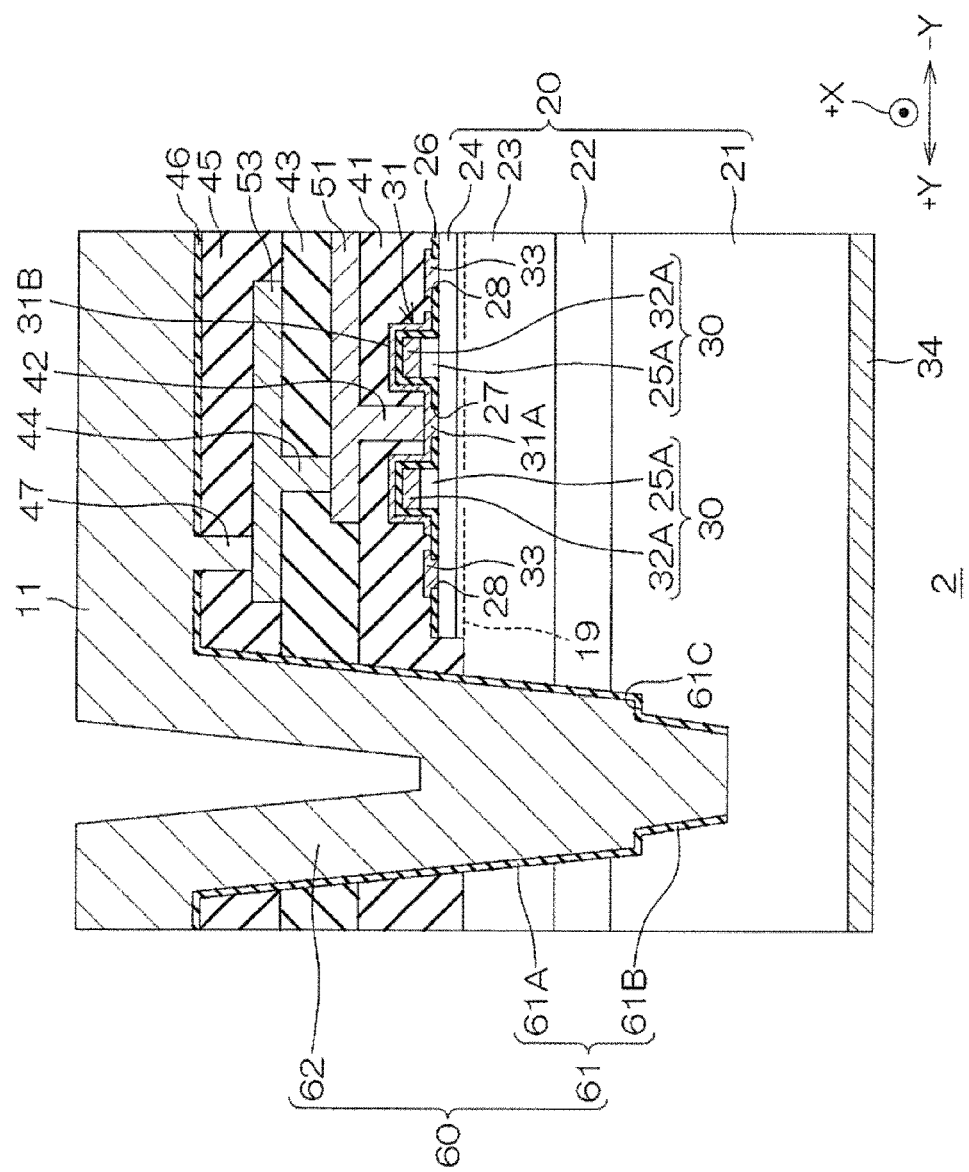
FIG. 4 is a cross-sectional diagram for illustrating the configuration of a semiconductor chip, and is a partial enlarged cross-sectional diagram taken along line IV-IV in FIG. 1.
Figure 5:
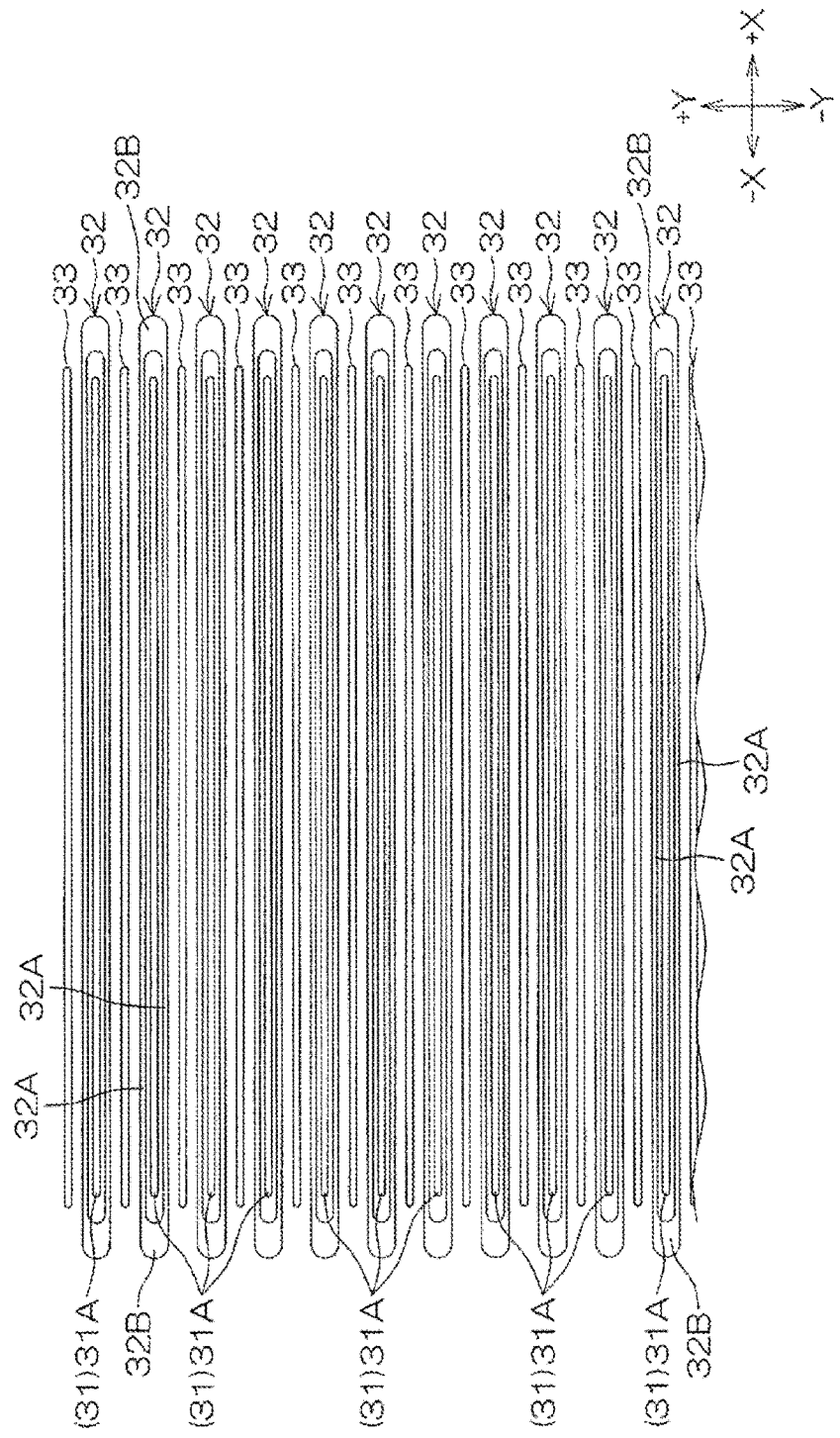
FIG. 5 is a schematic top view of an electrode metal structure.
Figure 6:
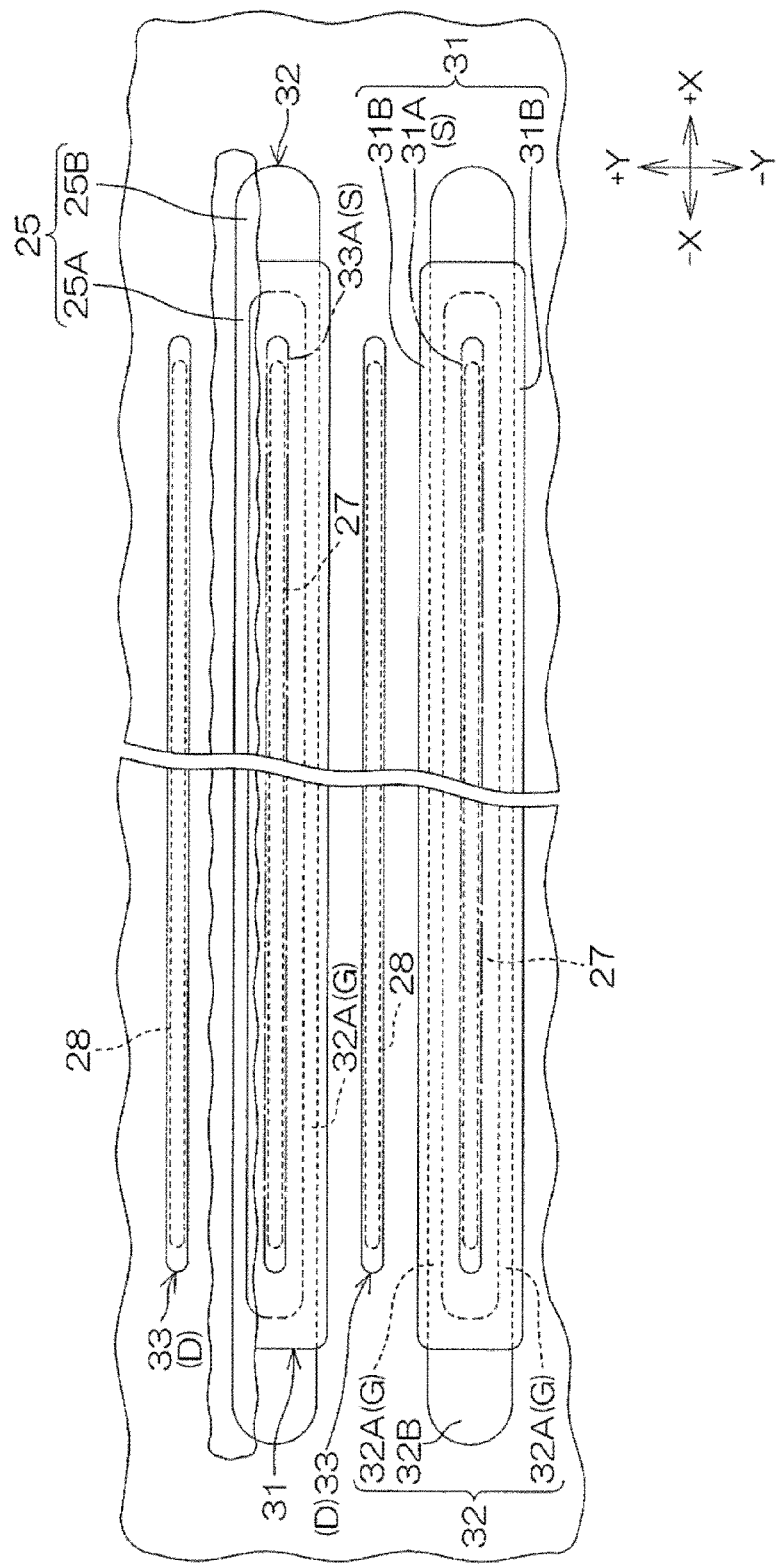
FIG. 6 is a partial enlarged top view of a part of FIG. 5.
Figure 7:
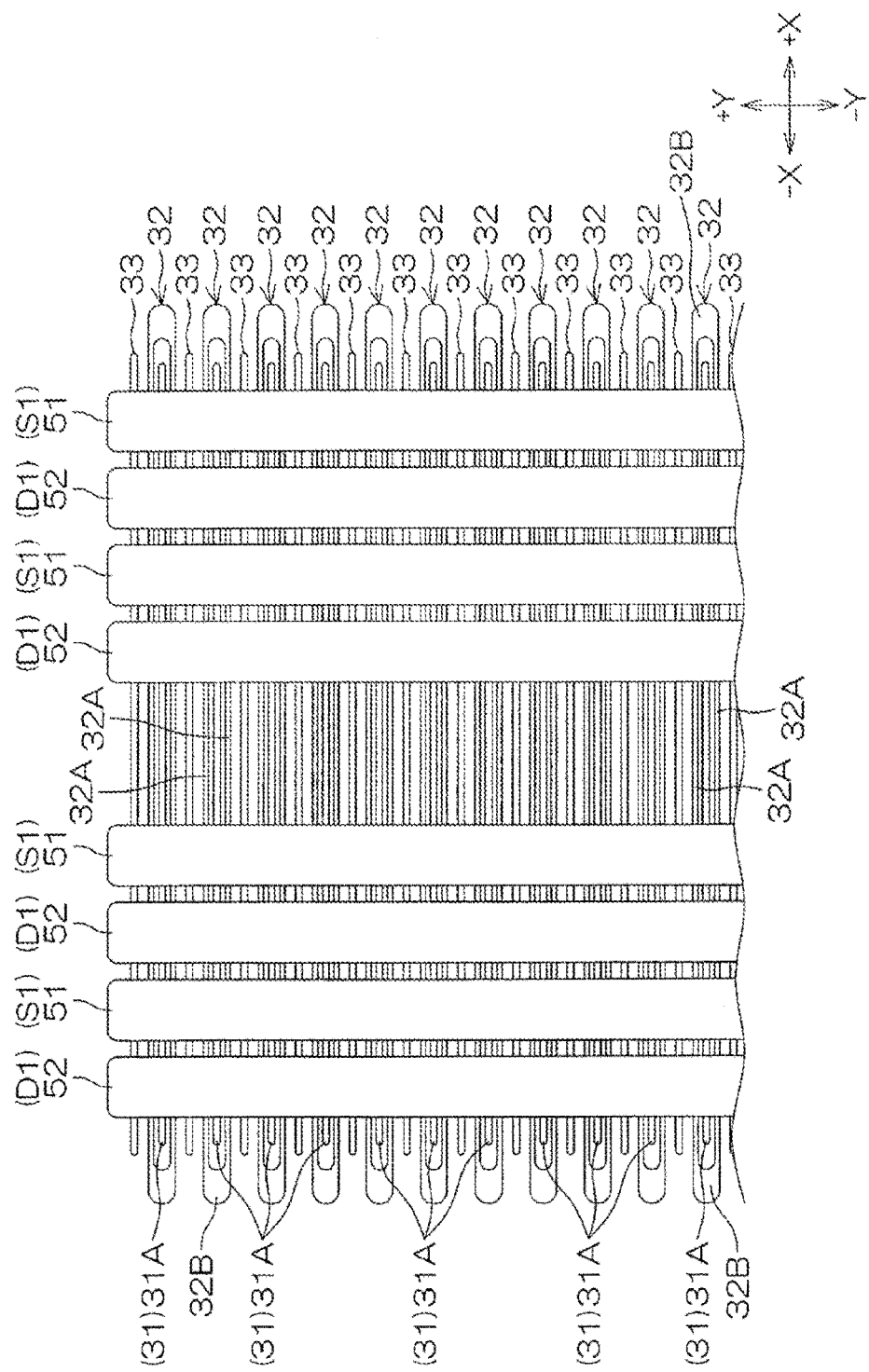
FIG. 7 is a schematic top view of a first-layer wiring metal structure formed on a first inter-layer insulative film.
Figure 8:
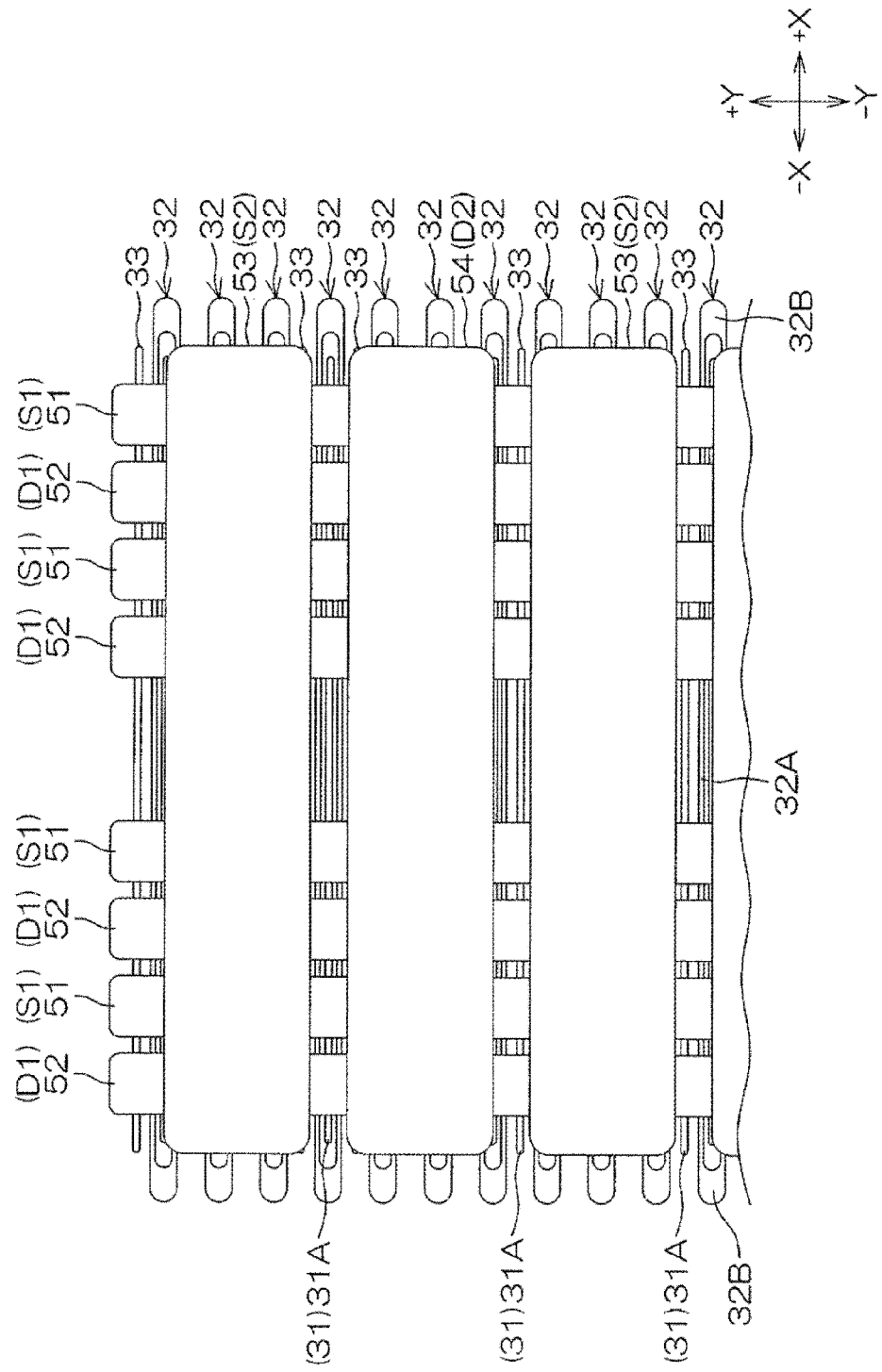
FIG. 8 is a schematic top view of a second-layer wiring metal structure formed on a second inter-layer insulative film.
Figure 9:
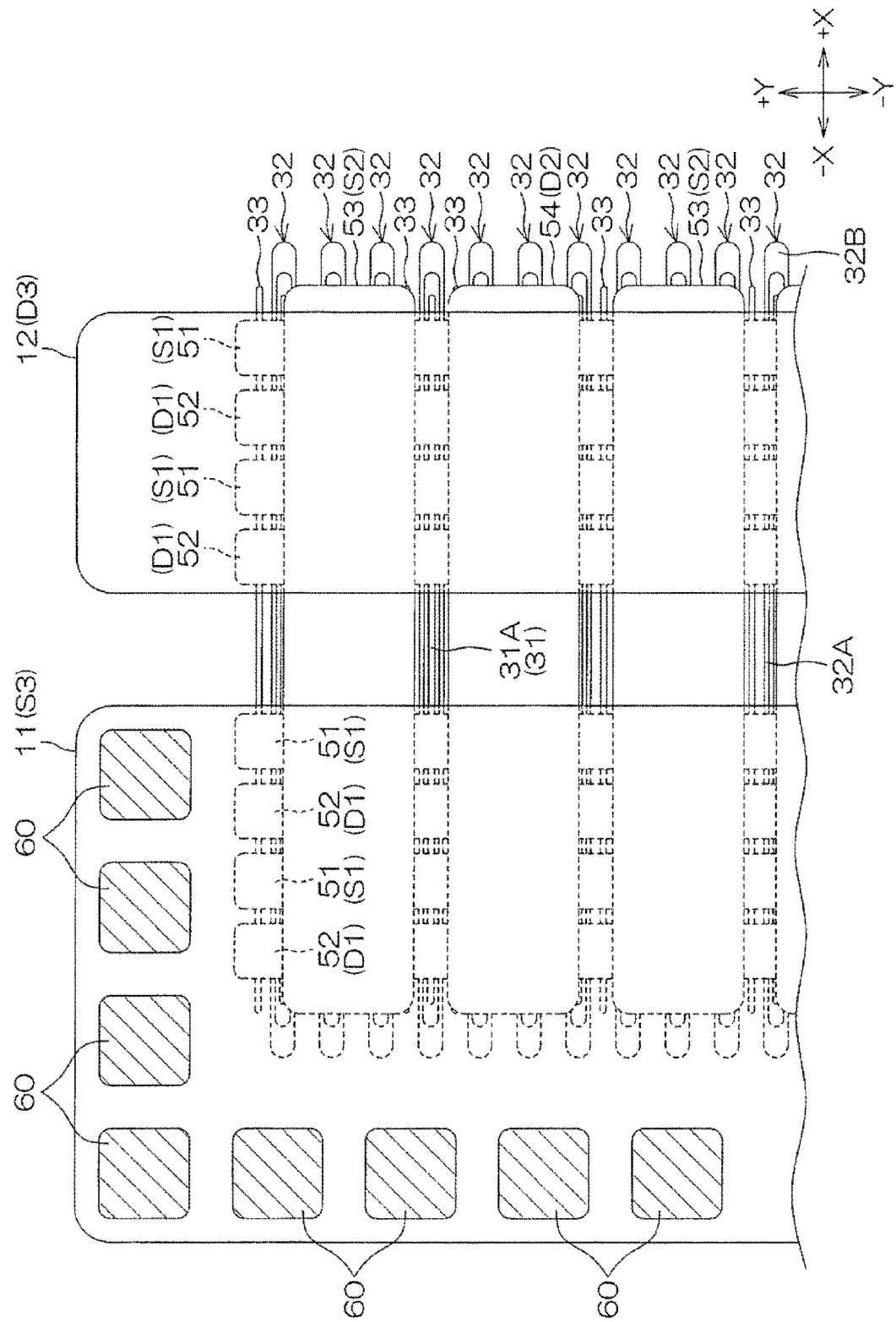
FIG. 9 is a schematic top view of a third-layer wiring metal structure (pad structure) formed on a third inter-layer insulative film.

FIG. 4 shows a cross-sectional diagram for illustrating the configuration of a semiconductor chip, and is a partial enlarged cross-sectional diagram taken along line IV-IV in FIG. 1. FIG. 5 shows a schematic top view of an electrode metal structure. FIG. 6 shows an enlarged top view of a part of FIG. 5. FIG. 7 is a schematic top view of a first-layer wiring metal structure formed on a first inter-layer insulative film; FIG. 8 is a schematic top view of a second-layer wiring metal structure formed on a second inter-layer insulative film; FIG. 9 is a schematic top view of a third-layer wiring metal structure (pad structure) formed on a third inter-layer insulative film;

The semiconductor chip 2 includes a semiconductor laminated structure 20, and an electrode metal structure disposed on the semiconductor laminated structure 20. Furthermore, the semiconductor chip 2 includes a first inter-layer insulative film 41 formed on the electrode metal structure, a first-layer wiring metal structure formed on the first inter-layer insulative film 41, a second inter-layer insulative film 43 formed on the first-layer wiring metal structure, and a second-layer wiring metal structure formed on the second inter-layer insulative film 43. Further, the semiconductor chip 2 includes a third inter-layer insulative film 45 formed on the second-layer wiring metal structure, and a third-layer wiring metal structure (pad structure) formed on the third inter-layer insulative film 45.

As shown in FIG. 4, the semiconductor laminated structure 20 includes the substrate 21, a buffer layer 22 formed on a front surface of the substrate 21, a first nitride semiconductor layer 23 epitaxially grown on the buffer layer 22, and a second nitride semiconductor layer 24 epitaxially grown on the first nitride semiconductor layer 23. However, the second nitride semiconductor layer 24 is not formed on a circumferential portion of the first nitride semiconductor layer 23. Furthermore, a surface layer portion on the circumferential portion of the first nitride semiconductor layer 23 corresponding to a region in which the second nitride semiconductor layer 24 is removed may also be removed.

The substrate 21 is a low-resistance silicon substrate in this embodiment. The low-resistance silicon substrate may be, for example, a p-type substrate having a resistance rate of 0.001 Ωmm to 0.5 Ωmm (more specifically, approximately 0.01 Ωmm to 0.1 Ωmm). In addition, apart from a low-resistance silicon substrate, the substrate 21 may also be a low-resistance SiC substrate or a low-resistance GaN substrate. The thickness of the substrate 21 in the semiconductor manufacturing process is, for example, approximately 650 μm, and is ground to a level equal to or less than 300 μm in a pre-chip stage.

The buffer layer 22 consists of a multilayer buffer layer formed by laminating a plurality of nitride semiconductor films in this embodiment. In this embodiment, the buffer layer 22 includes: a first buffer layer (not shown), connected to the front surface of the substrate 21 and including an AlN film; and a second buffer layer (not shown), laminated on a front surface of the first buffer layer (a surface on a side opposite to the substrate 21) and including an AlN/AlGaN superlattice layer. The first buffer layer has a film thickness of approximately 100 nm to 500 nm. The second buffer layer has a film thickness of approximately 500 nm to 2 μm. The buffer layer 22 may consist of, for example, a single film or a composite film of AlGaN.

The first nitride semiconductor layer 23 constitutes an electron transit layer. In this embodiment, the first nitride semiconductor layer 23 includes a GaN layer having a thickness of approximately 0.5 μm to 2 μm. Furthermore, to suppress leakage current flowing in the first nitride semiconductor layer 23, an impurity for configuring semi-insulation may also be introduced to a region apart from a region of the front surface. In this case, the concentration of the impurity is preferably equal to or more than $4 \times 10^{16}$ cm$^{-3}$. Furthermore the impurity is, for example, C or Fe.

The second nitride semiconductor layer 24 constitutes an electron supply layer. The second nitride semiconductor layer 24 includes a nitride semiconductor having a band gap larger than that of the first nitride semiconductor layer 23. In this embodiment, the second nitride semiconductor layer 24 includes a nitride semiconductor having an Al composition higher than that of the first nitride semiconductor layer 23. In the nitride semiconductor, the band gap increases as the Al composition gets higher. In this embodiment, the second nitride semiconductor layer 24 includes an $Al_{x1}Ga_{1-x1}N$ layer (0<x1<1) having a thickness of approximately 5 nm to 15 nm.

Thus, the first nitride semiconductor layer (electron transit layer) 23 and the second nitride semiconductor layer (electron supply layer) 24 include nitride semiconductors having different band gaps (Al compositions), such that lattice mismatch between the two is resulted. Furthermore, due to spontaneous polarization of the first nitride semiconductor layer 23 and the second nitride semiconductor layer 24, as well as piezoelectric polarization caused by the lattice mismatch between the two, the energy level of the conduction band of the first nitride semiconductor layer 23 in the interface between the first nitride semiconductor layer 23 and the second nitride semiconductor layer 24 is lower than the Fermi level. Accordingly, in first nitride semiconductor layer 23, a two-dimensional electron gas (2DEG) 19 expands at a position (for example, at a distance of several A from the interface) close to the interface between the first nitride semiconductor layer 23 and the second nitride semiconductor layer 24.

As shown in FIG. 4, FIG. 5 and FIG. 6, the electrode metal structure includes a plurality of source electrodes 31, a plurality of gate electrodes 32 and a plurality of drain electrodes 33. The source electrodes 31 and the drain electrodes 33 extend in the X direction.

Each gate electrode 32 includes a pair of gate main electrode portions 32A extending in parallel in the X direction, and two base portions 32B respectively connecting corresponding end portions of the pair of gate main electrode portions 32A to each other.

One source electrode 31 is formed in a manner of covering one pair of gate main electrode portions 32A of one gate electrode 32 in perspective view. As shown in FIG. 4 and FIG. 6, each source electrode 31 includes a source main electrode portion 31A disposed between a lengthwise middle portion of one pair of gate main electrode portions 32A of the gate electrode 32, and an extending portion 31B around the source main electrode portion 31A in perspective view. In this embodiment, the source main electrode portion 31A refers to, in the entire region of the source electrode 31 in perspective view, a region surrounded by the contour of a source contact hole 27 and a region of the peripheral region thereof. In FIG. 5, only the source main electrode portions 31A representative of the source electrodes 31 are depicted.

The extending portion 31B refers to, in the entire region of the source electrode 31 in perspective view, a portion apart from the source main electrode portion 31A. The extending portion 31B covers one pair of the gate main electrode portions 32A and a portion of two second base portions 32B of the gate electrode 32 in perspective view.

The drain electrodes 33 are disposed on both sides of one source electrode 31, respectively. The drain electrode 33 and the source main electrode portion 31A that are adjacent are opposite to each other with the gate main electrode portion 32A of the gate electrode 32 interposed in between in perspective view.

In the examples in FIG. 4, FIG. 5 and FIG. 6, the source main electrode portions 31A (S), the gate main electrode portions 32A (G) and the drain electrodes 33 (D) are cyclically disposed in order of DGSGDGS in the Y direction. Thus, the gate main electrode portions 32A (G) are sandwiched by the source main electrode portions 31A (S) and the drain electrodes 33 (D) to constitute a device structure.

On the second nitride semiconductor layer 24, a nitride semiconductor gate layer (to be referred to as a "semiconductor gate layer" hereinafter) 25 is partially formed. The semiconductor gate layer 25 is epitaxially grown to be formed on the front surface of the second nitride semiconductor layer 24.

The semiconductor gate layer 25 is shaped substantially the same as the gate electrodes 32 in perspective view. More specifically, the semiconductor gate layer 25 includes a pair of ridge portions 25A extending in parallel in the X direction, and two connecting portions 25B respectively connecting corresponding end portions of the pair of ridge portions 25A.

The gate electrode 32 is formed on the semiconductor gate layer 25. One pair of gate main electrode portions 32A of the gate electrode 32 are formed on one pair of ridge portions 25A of the semiconductor gate layer 25. Two base portions 32B of the gate electrode 32 are formed on two connecting portions 25B of the semiconductor gate layer 25.

The semiconductor gate layer 25 and the gate electrode 32 are loops in shape (enclosed curves) in perspective view, respectively. As shown in FIG. 4, the ridge portions 25A of the semiconductor gate layer 25 and the gate main electrode portions 32A formed thereon form ridge-shaped gate portions 30.

The semiconductor gate layer 25 includes a nitride semiconductor doped with an acceptor impurity. In this embodiment, the semiconductor gate layer 25 includes a GaN layer (p-type GaN layer) doped with an acceptor impurity, and has a thickness of approximately 40 nm to 100 nm. The concentration of the acceptor impurity implanted into the semiconductor gate layer 25 is preferably equal to or more than $1 \times 10^{19}$ cm$^{-3}$. In this embodiment, the acceptor impurity is Mg. The acceptor impurity may also be an acceptor impurity such as Zn apart from Mg.

The semiconductor gate layer 25 is provided for the purpose below, that is, in a region right below the gate portion 30, the energy level of the conduction band in the interface between the first nitride semiconductor layer 23 and the second nitride semiconductor layer 24 is changed, and the two-dimensional electron gas 19 is not generated in the region right below the gate portion 30 when no gate voltage is applied.

In this embodiment, the gate electrode 32 consists of a TiN layer, and has a thickness of approximately 50 nm to 200 nm. The gate electrode 32 may also consist of any single film of Ti, TiN and TiW, or a composite film of any combination including equal to or more than two thereof.

As shown in FIG. 4, on the second nitride semiconductor layer 24, a passivation film 26 covering an exposed surface of the second nitride semiconductor layer 24 and an exposed surface of the gate portion 30 is formed. Thus, the side surface and the front surface of the gate portion 30 are covered by the passivation film 26. In this embodiment, the passivation film 26 includes a SiN layer, and has a thickness of approximately 50 nm to 200 nm. The passivation film 26 may also consist of any single film of SiN, $SiO_2$ and SiON, or a composite film of any combination including equal to or more than two thereof.

Source contact holes 27 and drain contact holes 28 are formed at the passivation film 26. The source contact holes 27 and the drain contact holes 28 are formed with the gate portions 30 interposed in between.

A portion of the source main electrode portion 31A of each source electrode 31 enters the source contact hole 27, and becomes in contact with the second nitride semiconductor layer 24 in the source contact hole 27. As shown in FIG. 6, the extending portion 31B of each source electrode 31 covers one pair of gate portions 30 interposed with the source main electrode portion 31A of the source electrode 31. A portion of the extending portion 31B of the source electrode 31 covers a portion of the base portion 32B of each gate electrode 32. A portion of each drain electrode 33 enters the drain contact hole 28, and becomes in contact with the second nitride semiconductor layer 24 in the drain contact hole 28.

The source electrode 31 and the drain electrode 33 include, for example, a first metal layer (ohmic metal layer) connected to the second nitride semiconductor layer 24, a second metal layer (main electrode metal layer) laminated on the first metal layer, a third metal layer (bonding layer) laminated on the second metal layer, and a fourth metal layer (blocking metal layer) laminated on the third metal layer. The first metal layer is, for example, a Ti layer having a thickness of approximately 10 nm to 20 nm. The second metal layer is, for example, an Al-containing layer having a thickness of approximately 100 nm to 300 nm. The third metal layer is, for example, a Ti layer having a thickness of approximately 10 nm to 20 nm. The fourth metal layer is, for example, a TiN layer having a thickness of approximately 10 nm to 50 nm.

On the exposed surface of the first nitride semiconductor layer 23 and the passivation film 26, the first inter-layer insulative film 41 is formed in a manner of covering the source electrodes 31 and the drain electrodes 33. The first-layer wiring metal structure on the first inter-layer insulative film 41 includes first source wiring metals 51 (S1) and first drain wiring metals 52 (D1) extending in the Y direction, as shown in FIG. 4 and FIG. 7. In the example in FIG. 7, the first source wiring metals 51 and the first drain wiring metals 52 are alternately arranged in the X direction. The first source wiring metals 51 and the first drain wiring metals 52 are perpendicular to the source electrodes 31, the gate electrodes 32 and the drain electrodes 33.

The first source wiring metals 51 pass through a first source via 42 of the first inter-layer insulative film 41, and thus are electrically connected to the plurality of source electrodes 31 perpendicular to the first source wiring metals 51. The first drain wiring metals 52 pass through a first drain via (not shown) of the first inter-layer insulative film 41, and thus are electrically connected to the plurality of drain electrodes 33 perpendicular to the first drain wiring metals 52.

On the first inter-layer insulative film 41, the second inter-layer insulative film 43 is formed in a manner of covering the first source wiring metals 51 and the first drain wiring metals 52. The second-layer wiring metal structure on the second inter-layer insulative film 43 includes second source wiring metals 53 (S2) and second drain wiring metals 54 (D2) extending in the X direction, as shown in FIG. 4 and FIG. 8. In the example in FIG. 8, the second source wiring metals 53 and the second drain wiring metals 54 are alternately arranged in the Y direction. The second source wiring metals 53 and the second drain wiring metals 54 are perpendicular to the first source wiring metals 51 and the first drain wiring metals 52.

The second source wiring metals 53 pass through a second source via 44 of the second inter-layer insulative film 43, and thus are electrically connected to the first source wiring metals 51 perpendicular to the second source wiring metals 53. The second drain wiring metals 54 pass through a second drain via (not shown) of the second inter-layer insulative film 43, and thus are electrically connected to the plurality of first drain wiring metals 52 perpendicular to the second drain wiring metals 54.

On the second inter-layer insulative film 43, the third inter-layer insulative film 45 is formed in a manner of covering the second source wiring metals 53 and the second drain wiring metals 54. In the semiconductor laminated structure 20 and the first to third inter-layer insulative films 41, 43 and 45, a plurality of via holes 61 are formed. The via holes 61 penetrate the third inter-layer insulative film 45, the second inter-layer insulative film 43, the first inter-layer insulative film 41, the second nitride semiconductor layer 24, the first nitride semiconductor layer 23 and the buffer layer 22, and reaches the inner portion of the substrate 21. Details of the via holes 61 are to be described below. An insulative film 46 is formed on a front surface of the third inter-layer insulative film 45 and side surfaces of the plurality of via holes 61. The insulative film 46 is, for example, an insulative film including SiN.

The third-layer wiring metal structure on the third inter-layer insulative film 45 includes the source pad 11 (a third source wiring metal S3) and the drain pad 12 (a third drain wiring metal D3) extending in the Y direction, as shown in FIG. 4 and FIG. 9. Although not shown in either of FIG. 4 and FIG. 9, the third-layer wiring metal structure includes the gate pad 13 shown in FIG. 1.

Furthermore, the dimensions and configuration positions of the source pad 11 and the drain pad 12 in FIG. 9 do not correspond to those of the source pad 11 and the drain pad 12 in FIG. 1. The dimension ratios and configuration positions of the source pad 11 and the drain pad 12 relative to the front surface of the semiconductor chip 2 are precisely depicted in FIG. 1.

The source pad 11 and the drain pad 12 are perpendicular to the second source wiring metals 53 and the second drain wiring metals 54. The source pad 11 passes through the insulative film 46 and a third source via 47 of the third inter-layer insulative film 45, and thus is electrically connected to the plurality of second source wiring metals 53 perpendicular to the source pad 11. The drain pad 12 passes through the insulative film 46 and a third drain via (not shown) of the third inter-layer insulative film 45, and thus is electrically connected to the plurality of second drain wiring metals 54 perpendicular to the drain pad 12. The gate pad 13 is electrically connected to all the gate electrodes 32 by gate wires (not shown) formed in the semiconductor chip 2.

The first inter-layer insulative film 41, the second inter-layer insulative film 43 and the third inter-layer insulative film 45 include, for example, $SiO_2$. The first source wiring metals 51, the first drain wiring metals 52, the second source wiring metals 53, the second drain wiring metals 54, the source pad 11, the drain pad 12 and the gate pad 13 include, for example, AlCu.

In this embodiment, the plurality of via holes 61 are formed in an inner region of the source pad 11 and a proximate region of a first corner C1 (referring to FIG. 1) of the semiconductor chip 2. More specifically, in perspective view, the plurality of via holes 61 include a plurality of via holes 61 formed along one of two sides adjacent to the first corner C1 of the semiconductor chip 2, and a plurality of via holes 61 formed along the other side.

In this embodiment, a cross section of each via hole 61 may be a square in shape. The cross section of each via hole 61 may also be a circle or a rectangle apart from a square in shape. In this embodiment, each via hole 61 includes a first portion 61A and a second portion 61B, wherein the first portion 61A is formed by excavating from the front surface of the third inter-layer insulative film 45 into a surface layer portion of the substrate 21, and the second portion 61B is formed by excavating from a center portion of a bottom surface of the first portion 61A toward the back surface of the substrate 21.

Four side surfaces of the first portion 61A form inclining surfaces such that a cross section area of the first portion 61A gradually reduces downward. Four side surfaces of the second portion 61B also form inclining surfaces such that a cross section area of the second portion 61B gradually reduces downward. In perspective view, four sides of an upper cross section of the second portion 61B appear more recessed toward an inner side than opposite sides of a lower cross section of the first portion 61A, respectively. Thus, a rectangular stepped portion 61C is formed between the lower end of the side surfaces of the first portion 61A and the upper end of the side surfaces of the second portion 61B.

A conductive film 62 is formed on the insulative film 46 in the via holes 61. In addition, an insulative film 55 formed on side surfaces of each via hole 61 is provided for the following purpose, that is, parts of the buffer layer 22 that are not thoroughly insulated are insulated from the conductive film 62, thereby suppressing an electric current flowing in the conductive film 62 from leaking to the buffer layer 22.

The conductive film 62 includes, for example, AlCu. An upper end portion of the conductive film 62 is connected to the source pad 11, and a lower portion of the conductive film 62 is connected to the substrate 21. The vias 60 for external connection for connecting the source pad 11 to the substrate 21 are formed by the via holes 61 and the conductive film 62. In this embodiment, the source pad 11 and the conductive film 62 in the via holes 61 are formed simultaneously in the same fabrication process.

The back surface electrode 34 is formed on a back surface 21b of the substrate 21. The back surface electrode 34 includes, for example, Ni, Ag, Ti or Au, or a combination of equal to or more than two thereof.

In the semiconductor chip 2, the second nitride semiconductor layer (electron supply layer) 24 having a different band gap (Al composition) is formed on the first nitride semiconductor layer (electron transit layer) 23 so as to form a heterojunction. Hence, the two-dimensional electron gas 19 is formed in the first nitride semiconductor layer 23 near the interface between the first nitride semiconductor layer 23 and the second nitride semiconductor layer 24, and a HEMT using the two-dimensional electron gas 19 as a channel is formed. The gate main electrode portions 32A of the gate electrodes 32 are opposite to the second nitride semiconductor layer 24 with the ridge portions 25A of the semiconductor gate layer 25 interposed in between.

Below the gate main electrode portions 32A, the energy levels of the first nitride semiconductor layer 23 and the second nitride semiconductor layer 24 are increased by using the ionized acceptor included in the ridge portions 24A including the p-type GaN layer. Thus, the energy level of the conduction band in the heterojunction interface between the first nitride semiconductor layer 23 and the second nitride semiconductor layer 24 becomes higher than the Fermi level. Thus, right below the gate main electrode portions 32A (the gate portions 30), the two-dimensional electron gas 19 caused by spontaneous polarization of the first nitride semiconductor layer 23 and the second nitride semiconductor layer 24 and piezoelectric polarization resulted by the lattice mismatch between the two is not formed.

Thus, when a bias voltage (zero bias) is not applied to the gate electrodes 32, the channel formed by the two-dimensional electron gas 19 is cut off right below the gate main electrode portions 32A. As such, a normally off HEMT is achieved. If an appropriate on voltage (for example, 5 V) is applied to the gate electrodes 32, a channel is induced in the first nitride semiconductor layer 23 right below the gate main electrode portions 32A, and the two-dimensional electron gas 19 on both sides of the gate main electrode portions 32A is connected. Hence, the source and the drain are conducted.

To put to use, for example, a specified voltage (for example, 50 V to 100 V) that becomes positive on the side of the drain electrodes 33 is applied between the source electrodes 31 and the drain electrodes 33. In this case, the source electrodes 31 are set to a reference potential (0 V), and an off voltage (0 V) or an on voltage (5 V) is applied to the gate electrodes 32.

In the semiconductor device 1, the source electrodes 31 are connected to the source pad 11 through the first source via 42, the first source wiring metals 51, the second source via 44, the second source wiring metals 53 and the third source via 47. The source pad 11 is electrically connected to the source leads 4 serving as external source terminals through the vias 60 for external connection, the substrate 21, the back surface electrode 34 and the die pad 3.

Thus, compared to a situation where the source pad 11 is connected to the source leads 4 by metal wires, the parasitic inductance in the semiconductor device 1 is reduced.

Furthermore, the vias 60 for external connection are formed near the corner C1 that is closest to the source leads 4 in the semiconductor chip 2 in perspective view. Hence, when a main electric current flows between the source leads 4 and the drain leads 5 through the vias 60 for external connection, the path of the main electric current may be limited. Hence, forming of the potential distribution of the electric current flowing right below the semiconductor chip 2 may be suppressed, accordingly suppressing the change in characteristics such as the gate threshold voltage or current collapse, thereby achieving stable operations.

In this embodiment, the insulative film 46 is formed on the side surfaces of the first portions 61A of the via holes 61 and the side surfaces of the second portions 61B of the via holes 61; however, the insulative film 46 may not be formed on the side surfaces of the second portions 61B.

In addition, in this embodiment, the conductive film (to be referred to as a "first conductive film" hereafter) formed in the first portions 61A and the conductive film (to be referred to as a "second conductive film" hereafter) formed in the second portions 61B are made of the same material, but may be made of different materials. For example, the first conductive film may consist of AlCu the same as the source pad 11, and the second conductive film may consist of Ni ohmically connected to the Si substrate 21. As such, the resistance of the path of the main electric current from the source pad 11 to the back surface electrode 34 may be reduced.

Figure 10:
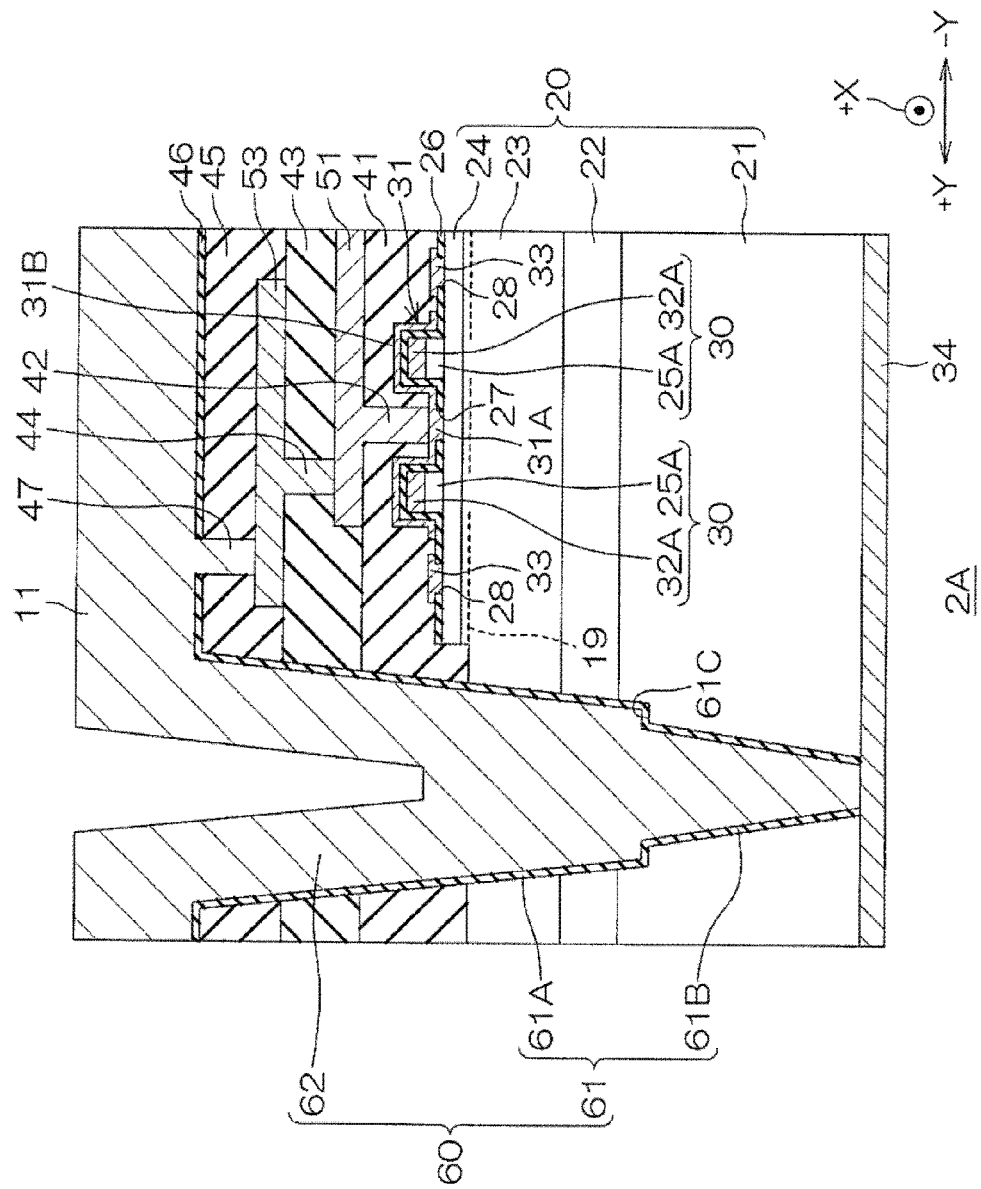
FIG. 10 is a cross-sectional diagram of a variation example of a semiconductor chip, and is a cross-sectional diagram corresponding to FIG. 4.

FIG. 10 shows a cross-sectional diagram of a variation example of a semiconductor chip, and is a cross-sectional diagram corresponding to FIG. 4. In FIG. 10, parts corresponding to those in FIG. 4 are denoted by the same numerals as FIG. 4.

In a semiconductor chip 2A, the vias 60 for external connection penetrate the substrate 21, and are connected to the back surface electrode 34. Specifically speaking, in the semiconductor chip 2A, the via holes 61 penetrate the substrate 21. More specifically, the second portions 61B of the via holes 61 penetrate the substrate 21. The insulative film 46 is formed in its entirety on the side surfaces of the via holes 61, and the conductive film 62 is formed on the insulative film 46. The lower end of the conductive film 62 is connected to the back surface electrode 34.

In the semiconductor chip 2A in FIG. 10, the resistance of the path of the main electric current from the source pad 11 to the back surface electrode 34 may be reduced.

In the semiconductor chip 2A in FIG. 10, the insulative film 46 is formed on the side surfaces of the first portions 61A and the second portions 61B; however, the insulative film 46 may not be formed on the side surfaces of the second portions 61B. In addition, the first conductive film formed in the first portions 61A and the second conductive film formed in the second portions 61B may be made of different materials. The first conductive film may consist of AlCu, and the second conductive film may consist of Ni ohmically connected to the Si substrate 21.

FIG. 11 to FIG. 14 show top views of variation examples of an arrangement pattern of the vias 60 for external connection, and are cross-sectional diagrams corresponding to FIG. 1. In FIG. 11 to FIG. 14, parts corresponding to those in FIG. 1 are denoted by the same numerals as FIG. 1.

Figure 11:
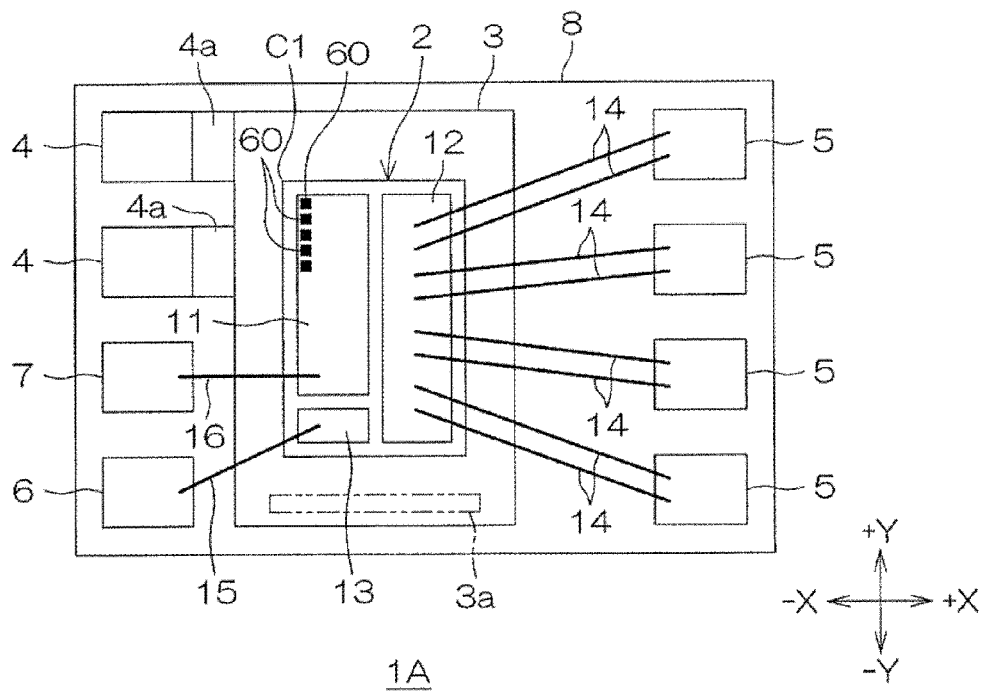
FIG. 11 is a top view of a variation example of an arrangement pattern of vias for external connection, and is a cross-sectional diagram corresponding to FIG. 1.

In a semiconductor device 1A in FIG. 11, the plurality of vias 60 for external connection are formed along only one side in the −X direction of two sides adjacent to the first corner C1 of the semiconductor chip 2.

Figure 12:
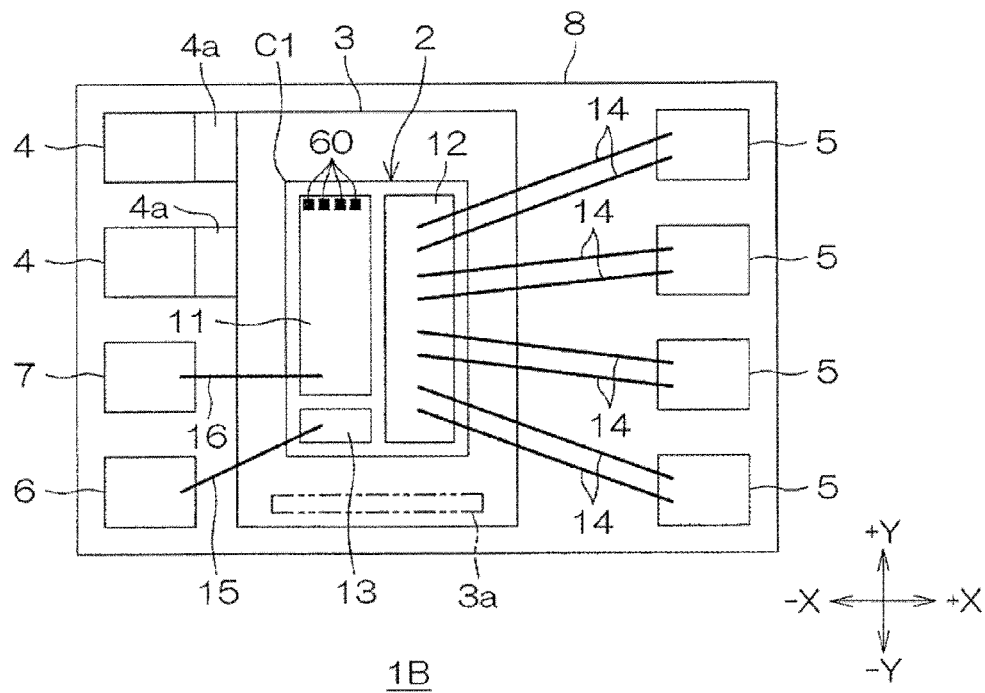
FIG. 12 is a top view of another variation example of an arrangement pattern of vias for external connection, and is a cross-sectional diagram corresponding to FIG. 1.

In a semiconductor device 1B in FIG. 12, the plurality of vias 60 for external connection are formed along only one side in the +Y direction of two sides adjacent to the first corner C1 of the semiconductor chip 2.

Figure 13:
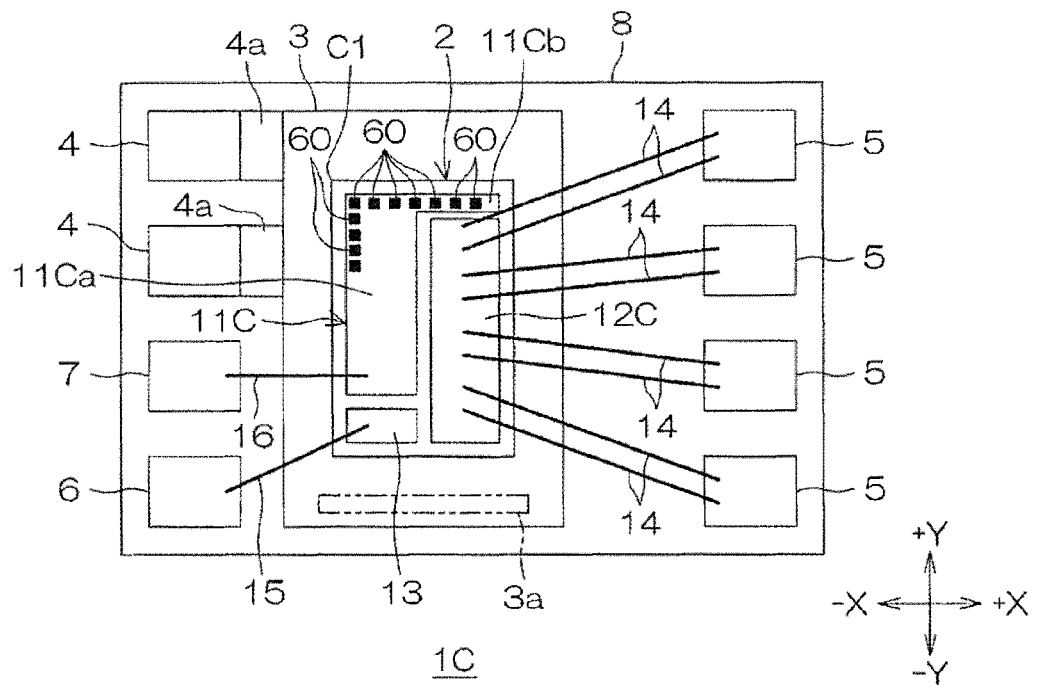
FIG. 13 is a top view of yet another variation example of an arrangement pattern of vias for external connection, and is a cross-sectional diagram corresponding to FIG. 1.

A drain pad 12C of a semiconductor device 1C in FIG. 13 has a shape that is formed by trimming an end portion in the +Y direction of the drain pad 12 of the semiconductor device 1 in FIG. 1. Thus, in the semiconductor device 1C in FIG. 13, in perspective view, a distance between the side in the +Y direction of the semiconductor chip 2 and a side in the +Y direction of the drain pad 12C is larger compared to that of the semiconductor device 1 in FIG. 1.

A source pad 11C of the semiconductor device 1C in FIG. 13 has a source pad body portion 11Ca the same as the drain pad 12 of the semiconductor device 1 in FIG. 1, and an extending portion 11Cb extending from the end portion in the +Y direction on the side in the +X direction of the source pad body portion 11Ca to the +X direction. The extending portion 11Cb extends from the end portion in the +Y direction on the side of the +X direction of the source pad body portion 11Ca to a region between the side in the +Y direction of the semiconductor chip 2 and the side in the +Y direction of the drain pad 12C.

In the semiconductor device 1C in FIG. 13, the plurality of vias 60 for external connection same as those of the semiconductor device 1 in FIG. 1 are formed, and the plurality of vias 60 for external connection are formed at intervals in the X direction in the extending portion 11Cb in perspective view.

Figure 14:
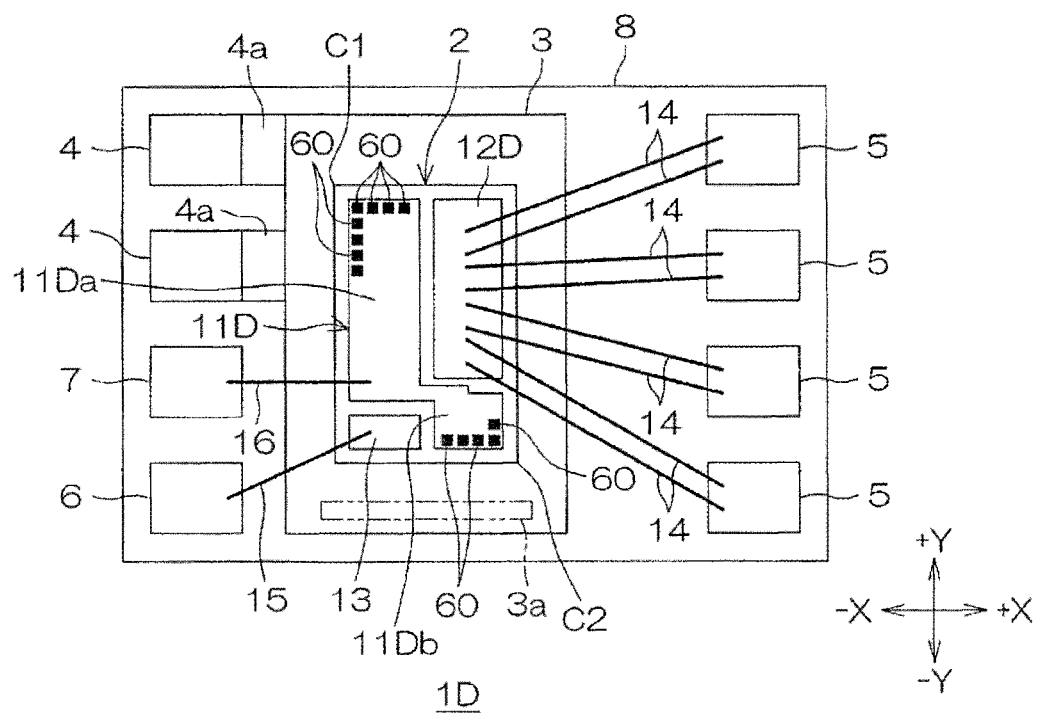
FIG. 14 is a top view of a further variation example of an arrangement pattern of vias for external connection, and is a cross-sectional diagram corresponding to FIG. 1.

A drain pad 12D of a semiconductor device 1D in FIG. 14 has a shape that is formed by trimming an end portion in the −Y direction of the drain pad 12 of the semiconductor device 1 in FIG. 1. The length in the Y direction of the trimmed portion is approximately twice the length in the Y direction of the gate pad 13. Hence, in perspective view, a trimmed region in which the drain pad 12D is not formed is formed near a second corner C2 that is diagonal to the first corner C1 of the semiconductor chip 2.

A source pad 11D of the semiconductor device 1D in FIG. 14 has a source pad body portion 11Da the same as the drain pad 12 of the semiconductor device 1 in FIG. 1, and an extending portion 11Db extending from the end portion in the −Y direction on the side in the +X direction of the source pad body portion 11Da to the +X direction and covering substantially an entire region of the trimmed region.

In the semiconductor device 1D in FIG. 14, the plurality of vias 60 for external connection same as those of the semiconductor device 1 in FIG. 1 are formed, and the plurality of vias 60 for external connection are formed along two sides adjacent to the second corner C2 and near the second corner C2 of the semiconductor chip 2 in perspective view.

Figure 15:
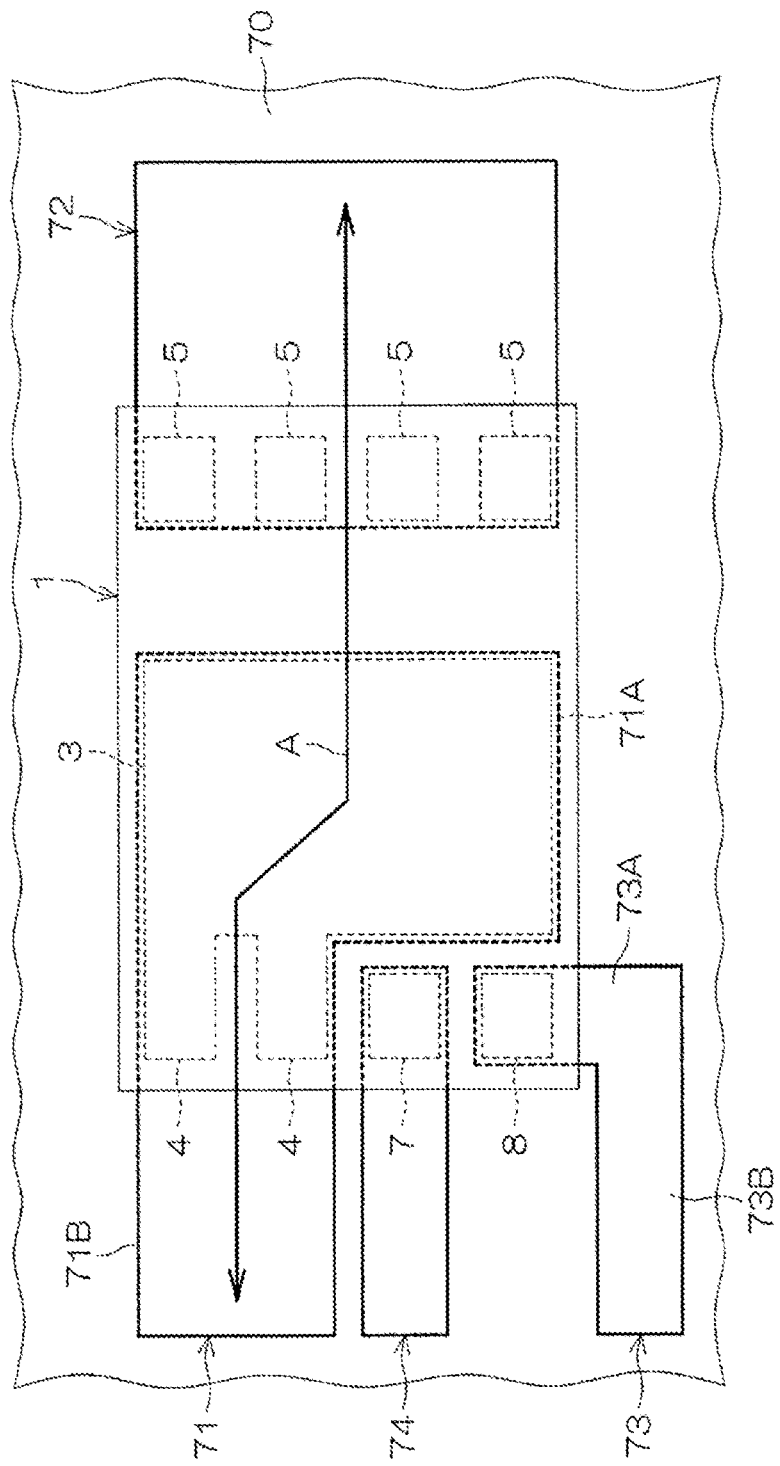
FIG. 15 is a schematic top view of an example of a wiring pattern on a wiring substrate mounted with the semiconductor device.

FIG. 15 shows a schematic top view of an example of a wiring pattern on a wiring substrate mounted with the semiconductor device 1. In FIG. 15, parts corresponding to those in FIG. 1 are denoted by the same numerals as FIG. 1. However, for illustration purposes, the semiconductor chip 2 is omitted.

On a wiring substrate 70, a source conductor layer 71, a drain conductor layer 72, a gate conductor layer 73 and a driving source conductor layer 74 serving as a wiring pattern are formed. The source conductor layer 71 includes a first portion 71A and a second portion 71B, wherein the first portion 71A is shaped as a rectangle that is lengthwise in the Y direction in perspective view, and the second portion 71B extends from the half portion in the +Y direction on the side of the −X direction of the first portion 71A toward the −X direction and is shaped as a rectangle that is lengthwise in the X direction in perspective view. In perspective view, the majority of the second portion 71B including the end portion in the −X direction protrudes from the side in the −X direction of the semiconductor device 1 toward the −X direction. A lower surface of the die pad 3 is bonded to a front surface of the first portion 71A, and lower surfaces of two source leads 4 are bonded to an edge portion in the +X direction of a front surface of the second portion 71B.

The drain conductor layer 72 is shaped as a rectangle that is lengthwise in the Y direction, and is disposed at an interval toward the +X direction from the source conductor layer 71. In perspective view, the majority of the drain conductor layer 72 including a side portion in the +X direction protrudes from the side in the +X direction of the semiconductor device 1 toward the +X direction. Lower surfaces of four drain leads 5 are bonded to an edge portion in the −X direction of the drain conductor layer 72.

The driving source conductor layer 74 is shaped as a rectangle that is lengthwise in the X direction in perspective view, and is disposed at an interval in the −Y direction from the second portion 71B of the source conductor layer 71. In perspective view, the majority of the driving source conductor layer 74 including an end portion in the −X direction protrudes from the side in the −X direction of the semiconductor device 1 toward the −X direction. The driving source lead 7 is bonded to an end portion in the X direction of a front surface of the driving source conductor layer 74.

The gate conductor layer 73 includes a first portion 73A and a second portion 73B, wherein the first portion 73A is disposed on the side of the −Y direction of the driving source lead 7 and is shaped as a rectangle that is lengthwise in the Y direction in perspective view, and the second portion 73B extends from the side in the −Y direction on the side in −X direction of the first portion 73A to the −X direction and is shaped as a rectangle that is lengthwise in the X direction in perspective view. In perspective view, the end portion in the −Y direction of the first portion 73A protrudes from the side in the −Y direction of the semiconductor device 1 toward the −Y direction. A lower surface of the gate lead 6 is bonded to a half part in the X direction of a front surface of the first portion 73A.

When the wiring pattern above is used, the main electric current flows along the X direction as indicated by the arrow A in FIG. 15. In this case, the arrangement pattern serving as the vias 60 for external connection is preferably an arrangement pattern in which a larger number of vias 60 for external connection as shown in FIG. 11 are formed on the path of a main electric current.

Figure 16:
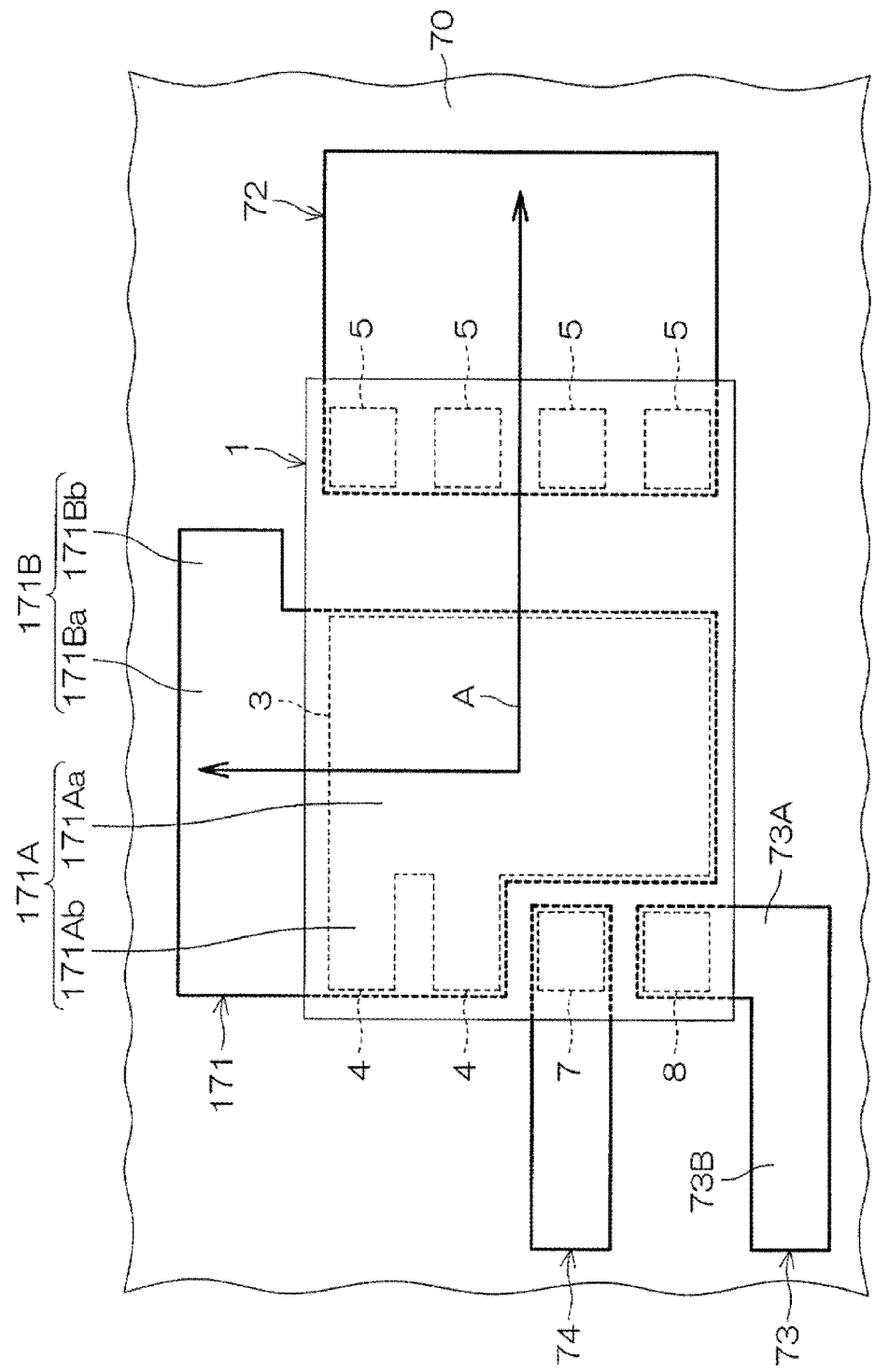
FIG. 16 is a schematic top view of another example of a wiring pattern on a wiring substrate mounted with the semiconductor device.

FIG. 16 shows a schematic top view of an example of a wiring pattern on a wiring substrate mounted with the semiconductor device 1. In FIG. 16, parts corresponding to those in FIG. 15 are denoted by the same numerals as FIG. 15. However, in FIG. 16, a source conductor layer is denoted by a numeral 171 that is different from that in FIG. 15.

In FIG. 16, the source conductor layer 171 is shaped differently from the source conductor layer 71 in FIG. 15. When the semiconductor device 1 is mounted on the wiring substrate 70, the source conductor layer 171 includes an inner portion 171A disposed on an inner side of the semiconductor device 1 in perspective view, and an outer portion 171B disposed on an outer side of the semiconductor device 1 in perspective view.

The inner portion 171A includes a first portion 171Aa and a second portion 171Ab, wherein the first portion 171Aa is shaped as a rectangle that is lengthwise in the Y direction, and the second portion 171Ab extends from a half part in the +Y direction on the side of the −X direction of the first portion 171Aa and is shaped as a rectangle that is lengthwise in the Y direction in perspective view. A lower surface of the die pad 3 is bonded to a front surface of the first portion 171Aa, and lower surfaces of two source leads 4 are bonded to a front surface of the second portion 171Ab.

The outer portion 171B includes a third portion 171Ba and a fourth portion 171Bb, wherein the third portion 171Ba extends from an entire region on a side edge in the +Y direction of the inner portion 171A toward the +Y direction and is shaped as a rectangle that is lengthwise in the X direction, and the fourth portion 171Bb protrudes from a region of the third portion 171Ba apart from an end portion in the −Y direction of the side edge in the +X direction toward the X direction.

When the wiring pattern above is used, the main electric current flows as L-shaped as indicated by the arrow A in FIG. 16 in perspective view. More specifically, the main electric current flows in the Y direction in the source conductor layer 171, and flows in the X direction in the drain conductor layer 72. In this case, the arrangement pattern serving as the vias 60 for external connection is preferably an arrangement pattern in which a larger number of vias 60 for external connection as shown in FIG. 12 are formed on the path of a main electric current.

It is known from the description associated with FIG. 15 and FIG. 16 that, the semiconductor device 1 is preferably connected to the wiring substrate 70 in a manner of having the main electric current flow near the vias 60 for external connection. Thus, when the vias 60 for external connection are formed near the first corner C1 of the semiconductor chip 2 as shown in FIG. 1, the semiconductor device 1 is connected to the wiring substrate 70 in a manner that the main electric current preferably does not flow and cross the side in the −Y direction of the semiconductor device 1. Thus, in order to remind a user of such condition, an elongated rectangular opening portion 3a in the X direction may be formed near the side in the −Y direction of the die pad 3 in perspective view as indicated the dashed-double-dotted line by in FIG. 1. Hence, forming of the potential distribution of the electric current flowing right below the semiconductor chip 2 may be suppressed, accordingly suppressing the change in characteristics such as the gate threshold voltage or current collapse, thereby achieving stable operations.

Furthermore, various design changes may be implemented within the scope of the items recited in the appended claims.

What is claimed is:

1. A semiconductor device, comprising:
   a semiconductor chip, comprising a front surface and a back surface, and comprising a source pad, a drain pad and a gate pad on the front surface;
   a die pad, disposed under the semiconductor chip and bonded to the back surface of the semiconductor chip;
   a source lead, electrically connected to the die pad;
   a drain lead and a gate lead, disposed on a periphery of the die pad; and
   a sealing resin, sealing the semiconductor chip, the die pad and each of the source lead, the drain lead, and the gate lead;
   wherein a plurality of vias for external connection are formed in the semiconductor chip to connect to the source pad,
   a first subset of the plurality of vias for external connection is disposed along a first side or a second side of the source pad to form a first edge of the source pad,
   the semiconductor chip comprises a substrate on a side of the back surface, and the plurality of vias for external connection are electrically connected to the substrate, and
   one end of each of the plurality of vias is connected to the source pad, and another end of each of the plurality of vias is connected to the substrate.

2. The semiconductor device according to claim 1, wherein the plurality of vias for external connection respectively comprise a via hole formed in the substrate and a conductive film formed in the via hole.

3. The semiconductor device according to claim 2, wherein the conductive film and the source pad are simultaneously formed.

4. The semiconductor device according to claim 2, wherein at least a part of a portion of the via hole formed in the substrate forms a bottom portion of the via hole; the conductive film comprises a first conductive film formed in the via hole on a portion apart from the bottom portion, and a second conductive film formed on the portion of the bottom portion in the via hole; and materials of the first conductive film and the second conductive film are different.

5. The semiconductor device according to claim 2, wherein an insulative film is formed on a side surface of the via hole.

6. The semiconductor device according to claim 2, wherein an inner surface of the via hole comprises an annular step portion that is formed in the substrate in a manner that a via hole diameter of a lower side is less than a via hole diameter of an upper side.

7. The semiconductor device according to claim 2, wherein the via hole reaches a back surface of the substrate.

8. The semiconductor device according to claim 1, wherein the die pad and the source lead are integrally formed.

9. The semiconductor device according to claim 1, wherein the drain pad and the drain lead are connected by a first metal connecting component, and the gate pad and the gate lead are connected by a second metal connecting component.

10. The semiconductor device according to claim 1, wherein the semiconductor chip comprises:
the substrate;
a first nitride semiconductor layer, formed on the substrate and forming an electron transit layer;
a second nitride semiconductor layer, formed on the first nitride semiconductor layer and forming an electron supply layer;
a ridge-shaped gate portion, formed on the second nitride semiconductor layer; and
a source electrode and a drain electrode, disposed opposite to each other on the second nitride semiconductor layer with the ridge-shaped gate portion interposed in between,
wherein the ridge-shaped gate portion comprises a nitride semiconductor gate layer and a gate electrode, the nitride semiconductor gate layer comprises an acceptor-type impurity disposed on the second nitride semiconductor layer and the gate electrode is disposed on the nitride semiconductor gate layer,
the source electrode is electrically connected to the source pad,
the drain electrode is electrically connected to the drain pad, and
the gate electrode is electrically connected to the gate pad.

11. The semiconductor device according to claim 10, wherein the semiconductor chip further comprises:
a first inter-layer insulative film, formed on the second nitride semiconductor layer and the ridge-shaped gate portion;
a first source wire, formed on the first inter-layer insulative film and connected to the source electrode;
a second inter-layer insulative film, formed on the first inter-layer insulative film in a manner of covering the first source wire;
a second source wire, formed on the second inter-layer insulative film and connected to the first source wire; and
a third inter-layer insulative film, formed on the second inter-layer insulative film in a manner of covering the second source wire,
wherein the source pad is formed on the third inter-layer insulative film and is connected to the second source wire.

12. The semiconductor device according to claim 1, wherein a distance between a via of the plurality of vias for external connection and the source lead is less than a distance between the via of the plurality of vias for external connection and the drain lead and is less than a distance between the via of the plurality of vias for external connection and the gate lead in plan view.

13. The semiconductor device according to claim 1, wherein the semiconductor chip is rectangular in plan view.

14. The semiconductor device according to claim 13, wherein the plurality of vias for external connection further comprise a via for external connection disposed along at least one of two sides extending in two directions from a second corner that is diagonal to a first corner in a plan view.

15. The semiconductor device according to claim 1, further comprising a driving source lead disposed on the periphery of the die pad, and the source pad and the driving source lead are connected by a third metal connecting component.

16. The semiconductor device according to claim 1, wherein the sealing resin includes an epoxy resin.

17. The semiconductor device according to claim 1, wherein the substrate includes one of a silicon substrate, a silicon carbide (SiC) substrate, and a gallium nitride (GaN) substrate.

18. The semiconductor device according to claim 1, further comprising a buffer layer adjacent to the substrate.

19. The semiconductor device according to claim 18, wherein the buffer layer is a multilayer structure of a plurality of nitride semiconductor films.

* * * * *